(12) United States Patent
Gronenborn et al.

(10) Patent No.: US 10,965,103 B2
(45) Date of Patent: Mar. 30, 2021

(54) LASER ARRANGEMENT COMPRISING A VCSEL ARRAY

(71) Applicant: TRUMPF Photonic Components GmbH, Ulm (DE)

(72) Inventors: Stephan Gronenborn, Ulm (DE); Holger Joachim Moench, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 0 days.

(21) Appl. No.: 16/802,588

(22) Filed: Feb. 27, 2020

(65) Prior Publication Data

US 2020/0194975 A1 Jun. 18, 2020

Related U.S. Application Data

(63) Continuation of application No. PCT/EP2018/073355, filed on Aug. 30, 2018.

(30) Foreign Application Priority Data

Aug. 30, 2017 (EP) .................................... 17188514

(51) Int. Cl.
*H01S 5/42* (2006.01)
*H01S 5/00* (2006.01)
(Continued)

(52) U.S. Cl.
CPC .............. *H01S 5/423* (2013.01); *H01S 5/005* (2013.01); *H01S 5/026* (2013.01);
(Continued)

(58) Field of Classification Search
CPC ...... H01S 5/18388; H01S 5/423; G01S 17/89; G01S 17/894
See application file for complete search history.

(56) References Cited

U.S. PATENT DOCUMENTS 6,121,983 A * 9/2000 Fork ......................... B41J 2/465
347/134
6,285,503 B1 * 9/2001 Chao ..................... G02B 5/0252
359/565

(Continued)

FOREIGN PATENT DOCUMENTS

KR 20170090703 A 8/2017
WO WO 2017055160 A1 4/2017

*Primary Examiner* — Michael Carter
(74) *Attorney, Agent, or Firm* — Leydig, Voit & Mayer, Ltd.

(57) ABSTRACT

A laser arrangement includes a VCSEL array comprising multiple VCSELs arranged on a common semiconductor substrate, an optical structure, and a diffusor structure. The optical structure is arranged to reduce a divergence angle of laser light emitted by each respective VCSEL to a section of the diffusor structure assigned to the respective VCSEL. The diffusor structure is arranged to transform the laser light received from the optical structure to transformed laser light such that a continuous illumination pattern is configured to be provided in a reference plane in a defined field-of-view. The diffusor structure is arranged to increase a size of the illumination pattern in comparison to an untransformed illumination pattern which can be provided without the diffusor structure. The VCSEL array, optical structure, and diffusor structure are arranged such that sections of the diffusor structure do not overlap. Diffusor properties of the diffusor structure vary across the diffusor structure.

20 Claims, 7 Drawing Sheets

(51) Int. Cl.
*H01S 5/026* (2006.01)
*H01S 5/183* (2006.01)

(52) U.S. Cl.
CPC ...... *H01S 5/18305* (2013.01); *H01S 5/18322* (2013.01); *H01S 5/18388* (2013.01)

(56) References Cited

U.S. PATENT DOCUMENTS

2007/0071056 A1\* 3/2007 Chen ................ G01S 17/87
372/50.124
2016/0164261 A1\* 6/2016 Warren ............... H01S 5/18388
348/164
2016/0311230 A1 10/2016 Conrads et al.

\* cited by examiner

LASER ARRANGEMENT COMPRISING A VCSEL ARRAY

CROSS REFERENCE TO RELATED APPLICATIONS

This application is a continuation of International Application No. PCT/EP2018/073355 (WO 2019/043102 A1), filed on Aug. 30, 2018, and claims benefit to European Patent Application No. EP 17188514.8, filed Aug. 30, 2017, the entire disclosures of which are hereby incorporated by reference herein.

FIELD

The invention relates to a laser arrangement comprising a vertical-cavity surface-emitting laser (VCSEL) array, a lighting device comprising such a laser arrangement, a time-of-flight camera comprising such a lighting device, and a method of manufacturing such laser arrangement.

BACKGROUND

Laser arrangements comprising a VCSEL array can be used for infrared illumination devices. Using short pulses VCSEL arrays are, for example, applied in time-of-flight applications. Such applications comprise e.g. short-range gesture recognition for portable devices and 3D space recognition. VCSEL arrays of about 1 $mm^2$ area with output power in the 1-10 W range are discussed for such applications. A specific field of illumination or view is defined by the application (e.g. a time-of-flight camera observing e.g. 70°×50°).

US 2016/0164261 A1 discloses methods, devices and systems for selectively illuminating different zones of a field of view by a multi-zone illumination device. The multi-zone illuminator may include a plurality of vertical cavity surface emitting lasers (VCSELs), and a plurality of micro-optical devices aligned with apertures of individual or groups of VCSELs, which are configured to be individually activated to provide adjustable illumination to different zones of a field of view of an image sensor.

SUMMARY OF THE INVENTION

In an embodiment, the present invention provides a laser arrangement including a VCSEL array comprising multiple VCSELs arranged on a common semiconductor substrate, an optical structure, and a diffusor structure. The optical structure is arranged to reduce a divergence angle of laser light emitted by each respective VCSEL to a section of the diffusor structure assigned to the respective VCSEL. The diffusor structure is arranged to transform the laser light received from the optical structure to transformed laser light such that a continuous illumination pattern is configured to be provided in a reference plane in a defined field-of-view. The diffusor structure is arranged to increase a size of the illumination pattern in comparison to an untransformed illumination pattern which can be provided without the diffusor structure. The VCSEL array, optical structure, and diffusor structure are arranged such that sections of the diffusor structure assigned to different VCSELs do not overlap. Diffusor properties of the diffusor structure vary across the diffusor structure. The variation of the diffusor properties is arranged to concentrate the illumination pattern in the defined field-of-view.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

The present application describes laser arrangements comprising a VCSEL array with improved illumination pattern in a reference plane in a field-of-view which can be illuminated by the laser arrangement.

According to a first aspect, a laser arrangement comprising at least one VCSEL array is provided. The VCSEL array comprises two, three, four or more VCSELs arranged on a common semiconductor substrate. The laser arrangement further comprises at least one optical structure and a diffusor structure. The optical structure is arranged to reduce a divergence angle of laser light emitted by each VCSEL to a section of the diffusor structure assigned to the respective VCSEL. The diffusor structure is arranged to transform the laser light received from the optical structure to transformed laser light such that a continuous illumination pattern can be provided in a reference plane in a defined field-of-view. The diffusor structure is further arranged to increase a size of the illumination pattern in comparison to an untransformed illumination pattern which can be provided without the diffusor structure. VCSEL array, optical structure and diffusor structure may be arranged (especially distance between VCSEL array, optical structure and diffusor structure and divergence angles prior and after the optical structure) such that the sections of the diffusor structure assigned to different VCSELs do not overlap in order to enable tailoring of the illumination pattern in the field of view by means of the diffusor structure. This does not exclude that there may some overlap in the outer part of the distribution because VCSEL emission is in a cone with smooth boundaries.

Concentrating or narrowing the beam profile of the laser light emitted by the VCSELs in a first step by means of the optical structure and subsequently spreading of the illumination pattern by means of the diffusor structure in comparison to a raw illumination pattern which could be provided by means of the VCSELs comprised by the VCSEL array without the diffusor structure enables a continuous illumination pattern of the scene in a defined field-of-view of the laser arrangement. Furthermore, the transformed laser light is concentrated in the reference plane such that losses due to transformed laser light outside the intended or defined field-of-view are reduced. The concentration may have the effect that at least 70%, preferably at least 80% and more preferably at least 90% of the transformed laser light illuminates the reference plane in the intended or defined field-of-view. In addition illumination in the corners of especially a large field-of-view (e.g. 100°×80°) may be improved. The illumination pattern is continuous in the sense that there are no steps. An intensity distribution function describing the illumination pattern in the reference plane is differentiable. Examples of such intensity distributions may, for example, be an essentially constant intensity in the reference plane in a defined field-of-view or an essentially constant intensity with respect to the solid angle defined by the respective field-of-view (this results in an intensity distribution in the reference plane which varies with the cube of cosine with respect to the angle to the optical axis connecting the reference plane and the center of the VCSEL array). The sectors illuminated by single VCSELs of the VCSEL array may overlap in the reference plane in the field-of-view. The sectors illuminated by single VCSELs may completely overlap in the reference plane in order to maximize redundancy. The transformed laser light which can be provided by the laser arrangement may therefore increases system efficiency in combination with laser safety.

The VCSELs are characterized by an active laser light emission area with an area between 3 µm$^2$ and 10000 µm$^2$. The pitch or distance between the VCSELs comprised by the VCSEL array may be between 20 µm and 250 µm. The density of the VCSELs and/or the size light emission area may be different depending on the position in the VCSEL array and/or the shape of the optical structure and the diffusor structure illuminated by the respective VCSEL such that the intensity distribution of the illumination pattern can be adapted.

The optical structure may be integrated on wafer level. The optical structure is integrated on wafer level by coupling the common optical structure to a surface of a semiconductor wafer comprising a multitude of VCSEL arrays and corresponding semiconductor substrates before separating the single VCSEL arrays. The optical structure is permanently coupled to the surface of the semiconductor wafer. The optical structure is preferably coupled to the surface of the semiconductor wafer such that it cannot be removed without damaging the respective VCSEL array. The optical structure may consist of a transparent (with respect to the e.g. infrared laser light) optical polymer (e.g. UV- or blue light curable polymers) deposited on top of the semiconductor layer structure of the VCSELs comprised by the VCSEL arrays after processing the VCSELs but before separating the single VCSEL arrays by, for example, dicing. The optical structure may alternatively be etched in the semiconductor substrate of the wafer. Alternatively or in addition a glass wafer comprising optical structures may be bonded, for example, by means of a transparent adhesive or any other suitable bonding technology to the semiconductor wafer comprising the multitude of VCSEL arrays.

The optical structure may be a continuous structure arranged above the light emitting surfaces of the VCSELs. The continuous structure may, for example, be a continuous "block" of polymer or a continuous surface structure etched in the semiconductor substrate or glass wafer.

The optical structure may comprise collimating micro lenses for reducing the divergence angle by collimating the laser light. Each VCSEL of the VCSEL array may be assigned to one specific collimating micro lens such that there is one micro lens per VCSEL. Micro lenses may be combined with a tailored diffusor structure characterized by varying diffusor properties (different diffusor profile) across the diffusor structure in order to improve illumination pattern and especially to concentrate the illumination pattern in the defined field-of-view. The micro lenses especially in combination with such a tailored diffusor structure may have the advantage that there is a much steeper fall-off at the outer rim of the three-dimensional intensity distribution such that more light is available in the field-of-view. Efficiency may therefore be increased.

The collimating micro lenses may be chirped micro lenses which are characterized by optical axes with varying inclination with respect to, for example, a surface parallel to the semiconductor substrate. Inclination of the optical axes may vary across the whole optical structure. Chirped micro lenses may improve laser safety and shape of the final light distribution or illumination pattern while maintaining the efficiency benefit if the diffusor structure is arranged at some distance to the VCSEL array with the optical structure. This may enable that at different parts of the diffusor structure the incident angle of the light provided by means of the optical structure is well-defined and smaller than the usual divergence angle of the laser light. Each part of the diffusor structure may have a different diffusor profile which is adapted to the respective incident angle of the laser light received from the optical structure. Inclination of the optical axis may alternatively or in addition be combined with tailored positioning of the micro lenses. Tailored positioning (e.g. no regular pattern) may in combination with a tailored diffusor may increase efficiency by concentrating the transformed laser light in the intended field-of-view.

The optical structure may alternatively or in addition comprise a partly reflective mirror structure. The partly reflective mirror structure is arranged to decrease a divergence angle of the VCSEL. The partly reflective mirror structure may be used to stabilize the VCSEL emission to a smaller divergence angle and less mode dynamics. The diffusor structure may be a tailored diffusor to concentrate the transformed laser light in the desired field-of-view. Advantage may be the much steeper fall-off in the slopes of the of the intensity distribution as described above resulting in higher efficiency due to concentration of the transformed laser light in the defined field-of-view. Furthermore, dependency of the beam profile after diffusor structure with respect to changes of driving currents supplied to the VCSELs of the VCSEL array and temperature of the VCSELs of the VCSEL array may be reduced.

Each VCSEL of the VCSEL array may be a top emitter which is arranged to emit the laser light in a direction away from the semiconductor substrate. The optical structure may comprise a material provided on top of a semiconductor layer structure of the VCSEL array. The material is transparent in the wavelength range of the laser light (e.g. in the wavelength range between 750 nm-1200 nm). The transparent material may be UV- or blue light curable optical polymer as described above. The transparent material may be provided on top of the mesas of the VCSELs. Alternatively, a planarization layer may be provided in order to provide an essentially plain surface at the level of the light emitting areas of the single VCSELs. The transparent material of the optical structure may be deposited on top of the planarization layer.

The VCSELs of the VCSEL array may alternatively be bottom emitters which are arranged to emit the laser light through the semiconductor substrate. The optical structure may in this case be provided on a surface of the semiconductor substrate which is arranged opposite with respect to processing surface on which the VCSELs are provided.

The optical structure may be integrated, especially etched in the semiconductor substrate of the VCSEL array. The high refractive index of the semiconductor substrate (gallium arsenide n~3.5) enables a relatively flat profile of the optical structure. A planarization layer may be provided after integrating the optical structure in the semiconductor substrate.

The optical structure may alternatively be provided on a glass wafer which is bonded to the semiconductor substrate. The optical structure may, for example, be etched in the glass wafer prior or after bonding to the wafer comprising the semiconductor substrates of the VCSEL array. The glass wafer may, for example, be glued.

The diffusor structure may be coupled to the optical structure by means of a bonding layer. The diffusor structure may be integrated in a transparent carrier like a glass substrate. The transparent carrier is mechanically coupled to the semiconductor substrate. The transparent carrier may, for example, be glued by means of an (in comparison to the refractive index of the semiconductor substrate) low refractive index adhesive to the surface of the optical structure. A planarization layer may be provided on top of the optical structure. The planarization layer may be characterized by a relatively low refractive index in comparison to the refractive index of the semiconductor substrate. The influence with respect to the optical properties of the optical structure may therefore be limited and/or be considered in the design of the optical structure. The diffusor structure may be provided in or on top of the planarization layer. One or more further material layers may, for example, be provided on top of the planarization layer. The diffusor structure may, for example, be provided by means of etching or structuring the one or more further material layers.

At least a part of the VCSELs may be arranged to be individually controlled to emit laser light. Each VCSEL or two, three, four or more groups of VCSELs of the VCSEL array may be arranged to be individually switched on or off in order to illuminate one or more sectors of the illumination pattern in a defined sequence. The VCSEL array comprises respective electrodes in order to enable individual control of the VCSELs or groups of VCSELs. Individual control of the VCSELs or groups of VCSELs (sub-arrays) may allow electronic adjustment of the illumination pattern (e.g. more light in a sector comprising an otherwise dark corner) or defined illumination sequences.

The sections of the diffusor structure may be arranged such that each VCSEL is arranged to illuminate a sector of the illumination pattern. Each sector may cover a part of the illumination. The sectors may preferably overlap in order to increase redundancy and in an extreme case cover the whole illumination pattern. The sections of the diffusor structure may comprise diffusor subsections wherein the diffusor subsection are arranged to spread the laser light received from the optical structure differently depending on the position of the respective VCSEL in the VCSEL array. The diffusor substructures are characterized by different diffusing properties (as described above) which may be enabled by different surface structures. Such an arrangement may enable a higher contrast between e.g. center of the beam directed to the center of the field-of-view and the large angles, where often a larger intensity is required to compensate for losses in the camera objective ($\cos^4$-law for camera objectives, leading to a decay of the signal on the CCD for objectives with a large field-of-view).

According to a second aspect a light emitting device is provided. The light emitting device comprises at least one laser arrangement as described above and an electrical driver for electrically driving the VCSELs of the VCSEL array. The light emitting device may further comprise a controller for providing control signals for controlling the electrical driver. The controller may, for example, comprise a storage device for storing data and a processing device for executing instructions comprised by the stored data. The stored data may, for example, comprise a sequence of providing an electrical drive current to the VCSELs or groups of VCSELs.

The laser arrangement or light emitting device may be used in consumer devices (e.g. smartphones), vehicles as well as high power industrial applications in order to support consumer and portable applications as gesture interface or 3D scanner in smart-phones, lap-top, tablets, etc., user interface or indoor navigation for robotics, sports, industry, lighting, etc., and high end for automotive mid-range detection (park assist, safe city driving), and high power industrial applications.

According to a third aspect a time-of-flight camera is provided. The time-of-flight camera comprises the light emitting device according to any embodiment described above, a light detector, an optical imaging structure and an evaluator. The optical imaging structure is arranged to image transformed laser light reflected by an object to the light detector. The evaluator is arranged to determine a distance to the object by means of the image of the transformed laser light detected by the light detector.

According to a fourth aspect a method of fabricating a VCSEL array according to any embodiment described above is provided. The method comprises the steps of: providing a semiconductor substrate, providing at least two VCSELs on the semiconductor substrate, providing an optical structure, providing a diffusor structure, and arranging the optical structure to reduce a divergence angle of laser light emitted by each VCSEL to a section of the diffusor structure assigned to the respective VCSEL, wherein the sections of the diffusor structure are arranged to transform the collimated laser light to transformed laser light such that a continuous illumination pattern can be provided in a reference plane in a defined field-of-view, and to increase a size of the illumination pattern in comparison to an untransformed illumination pattern which can be provided without the diffusor structure. The steps need not necessarily be performed in the order given above.

The optical structure may be provided and especially integrated on wafer level by several methods, among them grinding, lapping, etching, soft-cushion imprint lithography followed by etching, UV-replication of a master structure on the wafer followed by a etch-transfer of the replicated structure in the semiconductor substrate and the like. Furthermore, wafer bonding of e.g. a glass wafer comprising a multitude of optical structures to the semiconductor wafer may be used. Alternatively, a curable polymer may be provided and subsequently processed by means of processing light (e.g. UV or blue light). Details of such a process are described, for example, on page 2, line 2 to page 5, line 19 of WO 2017/055160 A1. Furthermore, FIGS. 2-10 and the corresponding description on page 9, line 20 to page 11, line 20 provides a special example of such a process. The disclosure of WO 2017/055160 A1 is incorporated by reference.

The optical structure may be covered by a planarization layer as described above. The planarization layer is characterized by a lower refractive index than a material of the optical structure. The optical structure may be designed with respect to the refractive index of the planarization layer in order to provide the desired illumination pattern. The planarization layer may be used to smooth the surface irregularities caused by the optical structure. The planarization layer may comprise materials like silicone, epoxy, polyimide, SiN and the like. The difference between the refractive index of the semiconductor layer structure (semiconductor substrate or one or more semiconductor layers) which is used to manufacture the optical structure and the refractive index of the planarization layer is sufficient to provide the illumination pattern for a multitude of applications. The planarization layer may protect the optical structure and may simplify further processing steps in order to provide the diffusor structure as described above.

Further advantageous embodiments are defined below.

Various embodiments of the invention will now be described by means of the Figures. In the Figures, like numbers refer to like objects throughout. Objects in the Figures are not necessarily drawn to scale.

Figure 1:
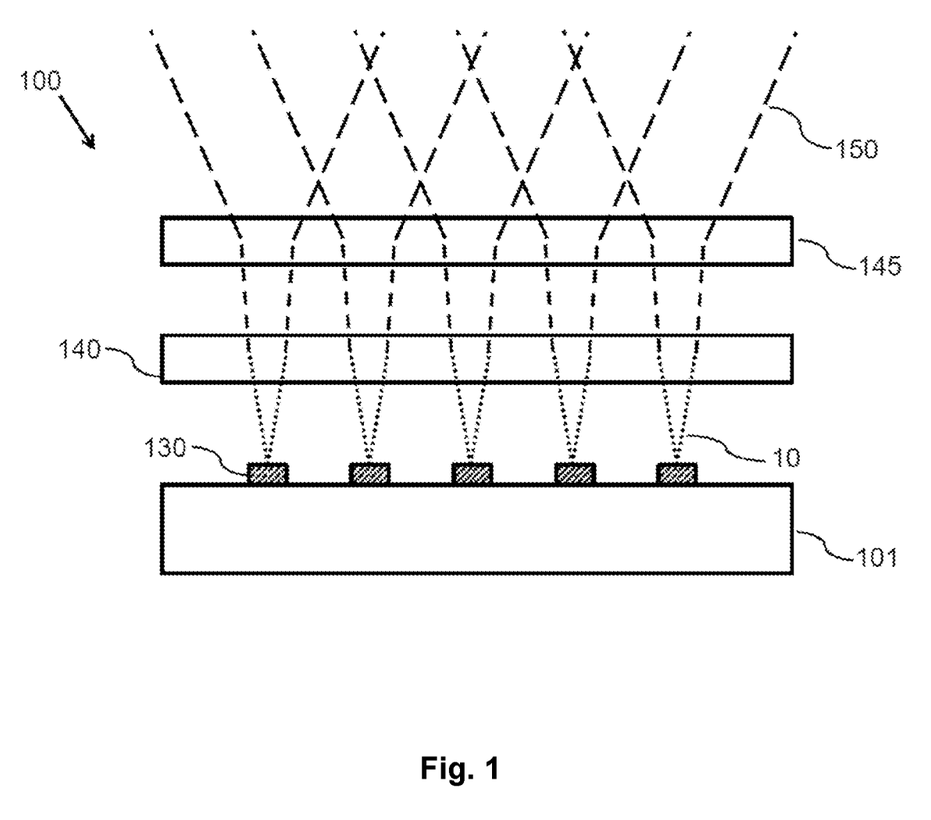
FIG. 1 shows a principal sketch of a cross-section of a first laser arrangement.

FIG. 1 shows a principal sketch of a cross-section of a first laser arrangement 100. The cross-section is taken across a line of VCSELs 130 of the VCSEL array comprised by the laser arrangement 100. Five mesas of top emitting VCSELs 130 provided on top of a semiconductor substrate are shown. Each VCSEL 130 emits laser light with divergence angle of around 20° in air. An optical structure 140 is arranged above the VCSELs 130 such that each VCSEL 130 illuminates one respective area of the optical structure 140. The optical structure is arranged to reduce the divergence angle of around 20° in air to a divergence angle of around 5° in air. The laser light 10 with reduced divergence angle reaches a section of a subsequent diffusor structure 145. The diffusor structure 145 transforms the laser light received from the optical structure 140 such that the transformed laser light 150 is spread in order to provide an illumination pattern 20 (see FIG. 6) with increased size in a reference plane in a field-of-view of the laser arrangement 100 in comparison to an untransformed illumination pattern which would be projected to the reference plane without the diffusor structure 145. The diffusor structure 145 may preferably be arranged to change the beam profile of the laser light received from the optical structure 140 in order to distribute the transformed laser light 150 across a large angle but at the same time restrict the illumination pattern to the predefined field-of-view in order to avoid losses by laser light outside the defined field-of-view (see FIG. 4).

Figure 2:
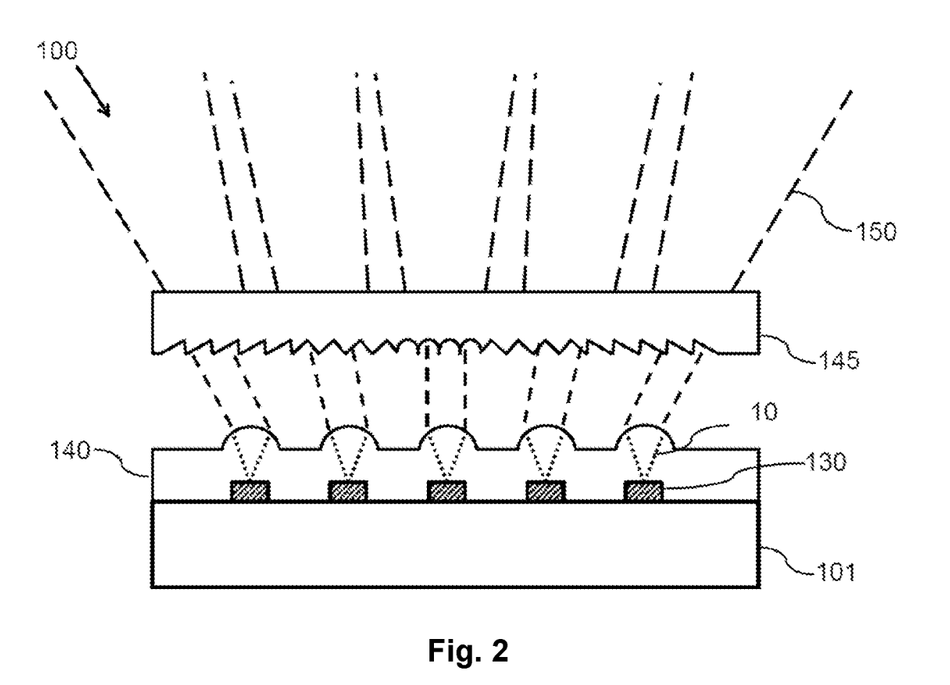
FIG. 2 shows a principal sketch of a cross-section of a second laser arrangement.

FIG. 2 shows a principal sketch of a cross-section of a second laser arrangement 100. The configuration of the VCSELs 130 and the semiconductor substrate 101 is essentially the same as discussed with respect to FIG. 1. The optical structure 140 consists of a curable optical polymer which is provided on top of a processing surface of the semiconductor substrate 101 and encloses the mesas of the VCSELs 130. The optical structure 140 comprises an array of chirped micro lenses wherein an inclination of the optical axis of the chirped micro lenses with respect to a surface parallel to the semiconductor substrate 101 decreases from the center such that the laser light with reduced divergence angle is tilted to the outside the higher a distance of the respective VCSEL 130 with respect to a VCSEL 130 in the center of the VCSEL array is. The laser light with reduced divergence angle is subsequently transformed to transformed laser light 150 by means of diffusor structure 145 which is characterized by a tailored structured surface comprising different diffusor substructures. The different diffusor substructures are aligned with the sections 147 (see FIG. 3) receiving the laser light with reduced divergence angle. The different or tailored diffusor substructures may enable a further improvement of the illumination pattern 20 in the field-of-view by enabling a more defined concentration of the transformed laser light in the predefined field-of-view.

Figure 3:
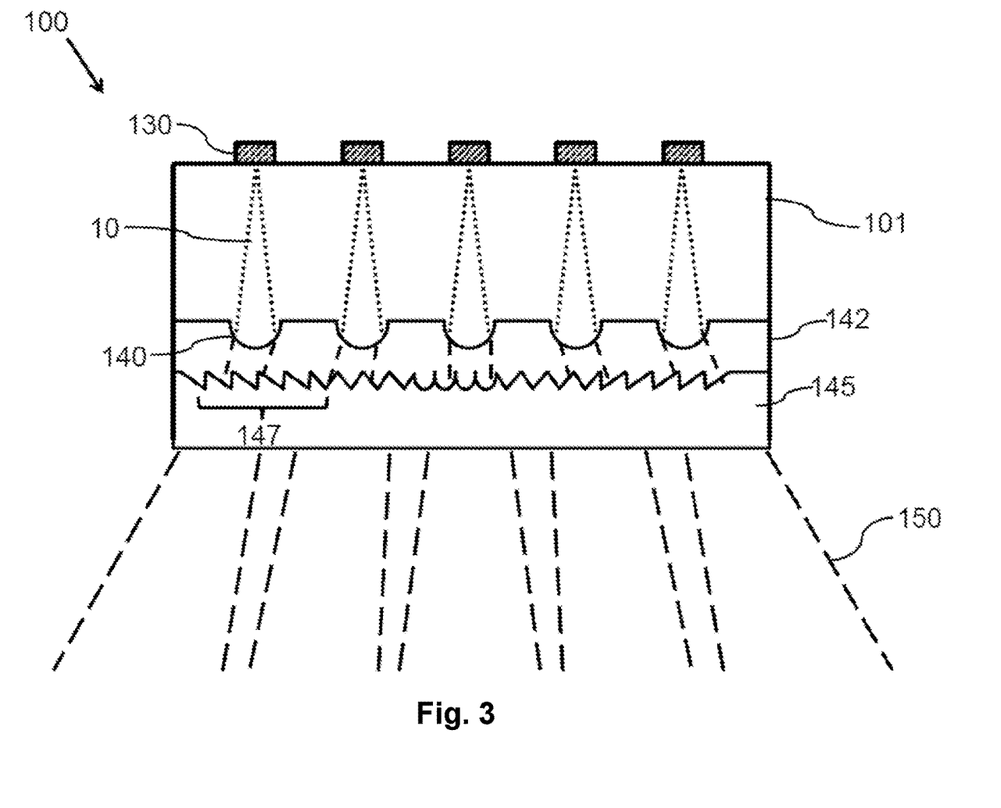
FIG. 3 shows a principal sketch of a cross-section of a third laser arrangement.

FIG. 3 shows a principal sketch of a cross-section of a third laser arrangement 100. The cross-section shows again an example with five VCSELs 130 emitting laser light 10 through the semiconductor substrate 101 (bottom emitter). The optical structure 140 comprises an array of chirped micro lenses similar as discussed with respect to FIG. 2. The array of chirped micro lenses is etched in the bottom surface (surface opposite to the surface on which the VCSELs 130 are processed) of the semiconductor substrate 101. The high refractive index of the GaAs semiconductor substrate 101 of n=3.5 enables a rather low-profile of the optical structure 140. A glass wafer consisting of a glass with a high refractive index (e.g. n=2 at the emission wavelength of the VCSELs 130) is bonded by means of a bonding layer 142 with a substantially lower refractive index (e.g. n=1.5 at the emission wavelengths of the VCSELs 130) to the semiconductor wafer comprising the VCSEL arrays 100. The bonding layer may, for example, be a polymer material with low optical absorption or a glass material with low softening temperature. The glass wafer comprises diffusor structures 145 which are aligned prior to the bonding process with the VCSEL arrays. The diffusor structure 145 is similar as discussed with respect to FIG. 2. The structured surface comprising the diffusor substructures is arranged on the bonding side of the diffusor structure 145. Design of the structured surface has therefore take into account the refractive index of the bonding layer 142. Arrangement of the structured surface on the bonding side does have the advantage that it is not possible to manipulate the structured surface of the diffusor structure 145 (e.g. by providing an oil droplet on the structured surface). The diffusor structure 145 may alternatively consist of a semiconductor material (e.g. GaAs) with high refractive index. The structured surface of the diffusor structure 145 (consisting of, for example, glass or semiconductor material) may alternatively be arranged on the side opposite to the bonding side which is in contact with the bonding layer 142. High refractive index material may have the advantage that it is more difficult to manipulate the diffusor structure 145 in order to increase laser safety of the laser arrangement 100.

Figure 4:
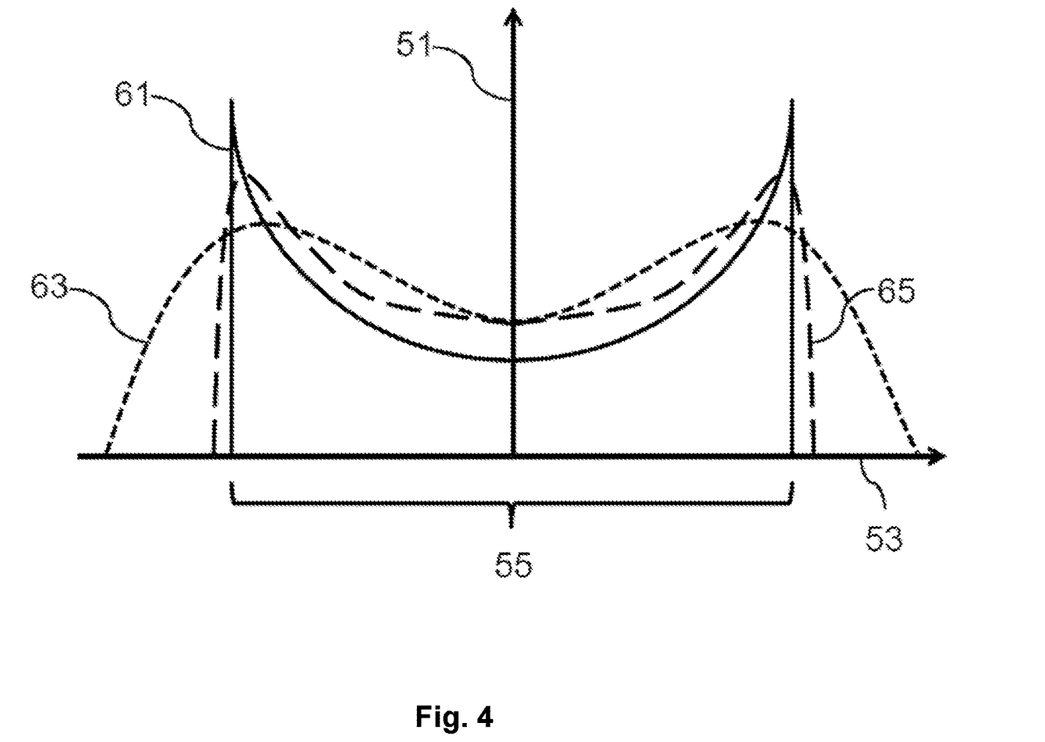
FIG. 4 shows examples of intensity distributions in one defined field-of-view.

FIG. 4 shows three examples of intensity distributions in one defined field-of-view. The ordinate is assigned to the intensity 51 and the abscissa is assigned to the angle 53 along one cross-section parallel to the surface of the illumination pattern in the field-of-view (e.g. along a horizontal center line of the illumination pattern shown in FIG. 5). The continuous line 61 shows a desirable reference intensity distribution. The intensity distribution 61 is sharply restricted to the angular range of the field-of-view 55. No light is lost outside the field-of-view. In practice and because of the finite divergence angle of the VCSEL it is not possible to realize such desired distribution. A second intensity distribution 63 shows an intensity distribution of typical VCSELs with a divergence angle of 20° in air with diffusor. The divergence of the laser light 10 smears out the profile of the tailored diffusor resulting in less light inside the angular range of the field-of-view 55. The intensity distribution 63 causes optical losses which may be 20% or higher especially if the desired intensity distribution requires a high intensity close to the edges. The improved intensity distribution 65 which can be provided by means of the laser arrangement comprising the optical structure 140 and the diffusor structure 145 decreases the losses by concentrating the transformed light essentially to the angular range of the field-of-view 55 similar as the ideal reference intensity distribution 61 and provides a better defined intensity profile across angular range of the field-of-view 55. The intensity in the center of the intensity distribution 65 is increased and less light is lost outside the field of view. The intensity distribution 65 across the angular range of the field-of-view 55 (and across the total three-dimensional field-of-view) can be tailored by means of the optical structure 140 and the diffusor structure 145 as described above. The tailored intensity distribution 65 may therefore enable an adaption to the camera optics of a time-of-flight camera.

Figure 5:
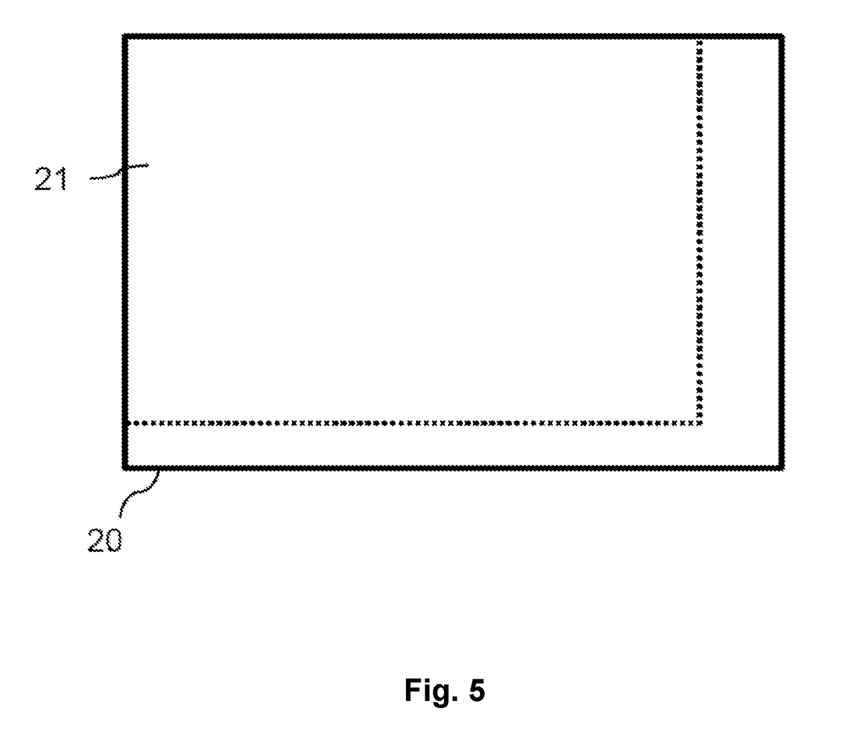
FIG. 5 shows a principal sketch of an illumination pattern.

The optical structure 140 in combination with the diffusor structure 145 may transform the laser light 10 to transformed laser light 150 such that the laser light of each VCSEL 130 may be directed to one associated sector 21 of the illumination pattern 20 in the defined field of view as shown in FIG. 5. Which VCSEL 130 is associated to one respective sector 21 depends on, for example, the inclination of an optical axis of a chirped microlens of the optical structure 140 to which the laser light 10 is directed and the corresponding substructure or section 147 of the diffusor structure 145. The associated sectors 21 may preferably overlap or be even identical with the defined field-of-view. The optical structure 140 in combination with the diffusor structure 145 transforms the laser light 10 such that the concentration (no collimation) of the transformed laser light 145 within the field-of-view may be improved and especially the tailored intensity distribution 65 across the field-of-view may be provided such that the illumination pattern 20 is essentially restricted to the defined field of view and in addition sufficient light is provided at the rim of the field of view (see tailored intensity distribution 65).

Figure 6:
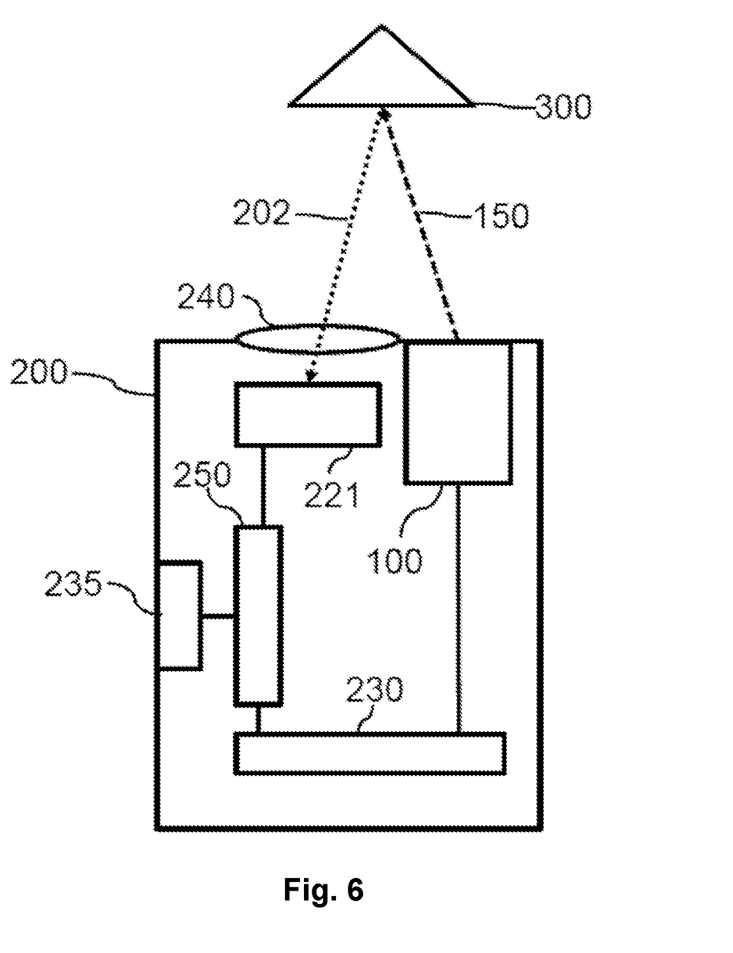
FIG. 6 shows a principal sketch of a time-of-flight sensor module.

FIG. 6 shows a principal sketch of a time-of-flight sensor module 200 which may be comprised in a time-of-flight camera. The time-of-flight sensor module 200 comprises a laser arrangement 100 in accordance with one of the embodiments discussed above. The time-of-flight sensor module 200 further comprises a detector 221 which is arranged to detect very short light pulses. Such short laser pulses may be caused by transformed laser light 150 emitted by the laser arrangement 100 hitting an object 300. A part of the transformed laser light 150 is reflected by the object 300 such that reflected laser light 202 is received by optical device 240 (e.g. camera optics comprising lens or lens arrangement) which images the received laser light to detector 221 (e.g. array of single photon avalanche diodes). The reflected laser light 202 causes a corresponding electrical signal or signals in the detector 221. An electrical driver 230 may be arranged to electrically drive the VCSEL array or optionally each VCSEL or sub-groups of VCSELs of the VCSEL array separately. A controller 250 is connected with the electrical driver 230 in order to control, for example, start and stop time of the laser pulses emitted by the VCSEL array. The controller 250 is further connected with the detector 221 in order to receive the electrical signal or signals caused by the reflected laser light 202 detected by detector 221. The time-of-flight sensor module 200 further comprises an optional interface 235 to transfer start and stop time of the transformed laser light 150 emitted by the corresponding VCSEL or group of VCSELs, information about the illumination pattern 20 in the field-of-view as well as time of reception of the electrical signal or signals caused by the reflected laser light 202. The transferred data can be used to calculate the time-of-flight of the laser light and therefore a distance between the time-of-flight sensor module 200 and the object 300. The time-of-flight sensor module 200 may alternatively comprise an evaluator (not shown) electrically connected with the controller 250 (or may comprise or be comprised by controller 250) in order to determine the distance(s) to the object. Several distance measurements may be used to determine a velocity or even an acceleration of the object 300. The illumination pattern provided by means of the VCSEL array may be adapted to the optical device 240. The intensity may, for example, increase at the rim of the illumination pattern 20 in order to compensate optical losses of the optical device 240 (see tailored intensity distribution 65).

Figure 7:
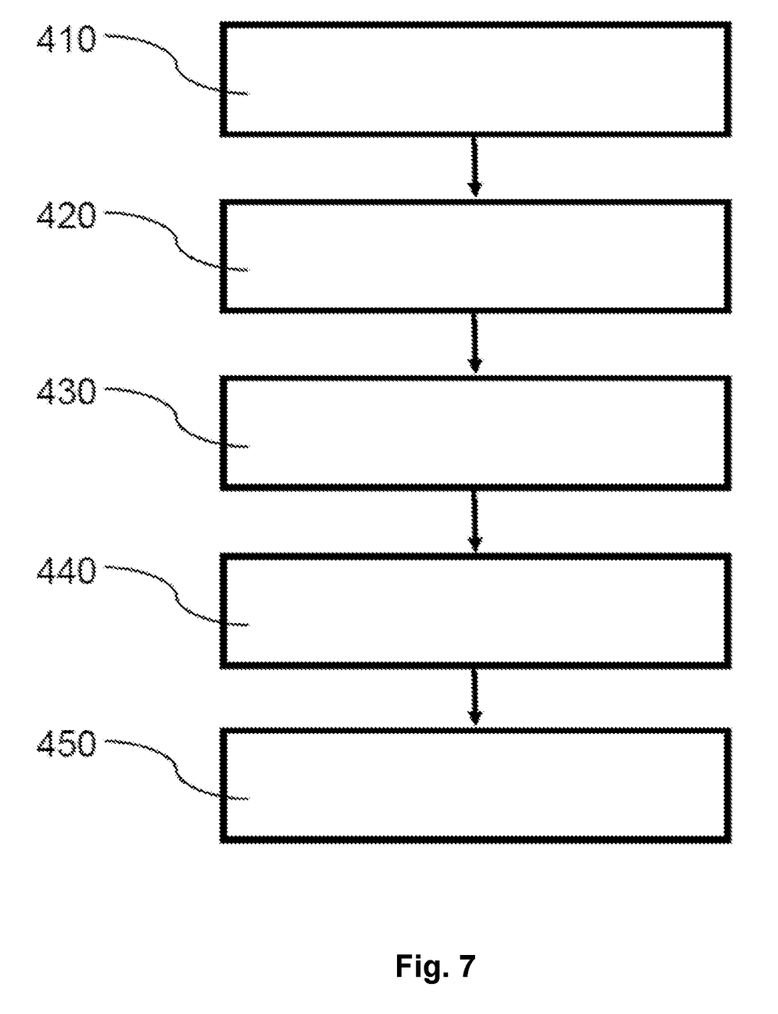
FIG. 7 shows a principal sketch of a process flow of a method of fabricating a VCSEL array.

FIG. 7 shows a principal sketch of a process flow of a method of fabricating a VCSEL array 100. In step 410 a semiconductor substrate 101 is provided. The semiconductor substrate 101 is part of a semiconductor wafer. In the subsequent step 420 at least two VCSELs 130 are provided on a processing side of the semiconductor substrate 101. An optical structure 140 is provided in step 430 such that one optical structure 140 is associated with one corresponding VCSEL array. The diffusor structure 145 is provided in step 440. The optical structure 140 is arranged in step 450 to reduce a divergence angle of laser light 10 emitted by each VCSEL 130 to a section 147 of the diffusor structure 145 assigned to the respective VCSEL 130. The sections 147 of the diffusor structure 145 are arranged to transform the collimated laser light to transformed laser light 150 such that a continuous illumination pattern 20 can be provided in a reference plane, and to increase a size of the illumination pattern 20 in comparison to an untransformed illumination pattern which can be provided without the diffusor structure.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 laser light
20 illumination pattern
21 sector of illumination pattern
51 intensity
53 angle
55 angular range of field-of-view 61 ideal reference intensity distribution
63 intensity distribution of typical VCSEL with diffusor
65 improved intensity distribution
100 laser arrangement
101 semiconductor substrate
130 VCSEL
140 optical structure
143 bonding layer
145 diffusor structure
147 section of diffusor structure
150 transformed laser light
200 time-of-flight sensor module
202 reflected laser light
221 light detector
230 electrical driver
235 interface
240 optical device
250 controller
300 object
410 step of providing semiconductor substrate
420 step of providing at least two VCSELs
430 step of providing optical structure
440 step of providing diffusor structure
450 step of arranging optical structure and diffusor structure

What is claimed is:

1. A laser arrangement comprising:
a VCSEL array comprising multiple VCSELs arranged on a common semiconductor substrate;
an optical structure; and
a diffusor structure,
wherein the optical structure is arranged to reduce a divergence angle of laser light emitted by each respective VCSEL to a section of the diffusor structure assigned to the respective VCSEL,
wherein the diffusor structure is arranged to transform the laser light received from the optical structure to transformed laser light such that a continuous illumination pattern is configured to be provided in a reference plane in a defined field-of-view,
wherein the diffusor structure is arranged to increase a size of the illumination pattern in comparison to an untransformed illumination pattern which can be provided without the diffusor structure,
wherein the VCSEL array, optical structure, and diffusor structure are arranged such that the sections of the diffusor structure assigned to different VCSELs do not overlap,
wherein diffusor properties of the diffusor structure vary across the diffusor structure,
wherein the variation of the diffusor properties is arranged to concentrate the illumination pattern in the defined field-of-view,
wherein the diffusor structure comprises diffusor substructures to vary the diffusor properties which are aligned with the sections receiving the laser light with reduced divergence angle, and
wherein the diffusor substructures are configured with different surface structures to spread laser light received from the optical structure differently depending on the position of the respective VCSEL in the VCSEL array.

2. The laser arrangement according to claim 1, wherein the optical structure is integrated on wafer level.

3. The laser arrangement according to claim 1, wherein the optical structure comprises collimating micro lenses configured to reduce the divergence angle by collimating the laser light.

4. The laser arrangement according to claim 3, wherein the collimating micro lenses are chirped micro lenses.

5. The laser arrangement according to claim 1, wherein each respective VCSEL is a top emitter arranged to emit the laser light in a direction away from the semiconductor substrate,
wherein the optical structure comprises a material provided on top of a semiconductor layer structure of the VCSEL array, and
wherein the material is transparent in a wavelength range of the laser light.

6. The laser arrangement according to claim 1, wherein each respective VCSEL is a bottom emitter arranged to emit the laser light through the semiconductor substrate,
wherein the optical structure is provided on a surface of the semiconductor substrate which is arranged opposite with respect to the multiple VCSELs.

7. The laser arrangement according to claim 6, wherein the optical structure is a collimating optical structure integrated in a semiconductor layer structure of the VCSEL array.

8. The laser arrangement according to claim 6, wherein the optical structure comprises a material provided on top of a semiconductor layer structure of the VCSEL array, the material being transparent in a wavelength range of the laser light.

9. The laser arrangement according to claim 1, wherein at least a part of the multiple VCSELs are arranged to be individually controlled to emit laser light.

10. The laser arrangement according to claim 1, wherein the sections of the diffusor structure are arranged such that each VCSEL is arranged to illuminate a sector of the illumination pattern, wherein each sector overlaps at least with one other sector.

11. The laser arrangement according to claim 1, wherein the optical structure comprises a partly reflective mirror structure, wherein the partly reflective mirror structure is arranged to decrease the divergence angle of the laser light emitted by each respective VCSEL.

12. A light emitting device comprising:
a laser arrangement array according to claim 1; and
an electrical driver for providing an electrical drive current to the multiple VCSELs.

13. A time-of-flight camera comprising:
the light emitting device according to claim 12, and
a light detector configured to detect transformed laser light reflected by an object,
wherein an evaluator is arranged to determine a distance to the object based on the transformed laser light detected by the light detector.

14. A method of fabricating a laser arrangement, the method comprising:
providing a semiconductor substrate;
providing multiple vertical-cavity surface-emitting lasers (VCSELs) on the semiconductor substrate;
providing an optical structure;
providing a diffusor structure having a plurality of sections; and
arranging the optical structure to reduce a divergence angle of laser light emitted by each respective VCSEL to a respective section of the diffusor structure assigned to the respective VCSEL, wherein plurality of sections of the diffusor structure are arranged to transform the laser light received from the optical structure to transformed laser light such that a continuous illumination pattern is configured to be provided in a reference plane in a defined field-of-view, and to increase a size of the illumination pattern in comparison to an untransformed illumination pattern which can be provided without the diffusor structure, wherein the VCSEL array, optical structure, and diffusor structure are arranged such that sections of the diffusor structure assigned to different VCSELs do not overlap, wherein diffusor properties of the diffusor structure (vary across the diffusor structure, wherein the variation of the diffusor properties is arranged to concentrate the illumination pattern in the defined field-of-view, and wherein the diffusor structure comprises diffusor substructures to vary the diffusor properties which are aligned with the sections receiving the laser light with reduced divergence angle, and wherein the diffusor substructures are configured with different surface structures to spread laser light received from the optical structure differently depending on the position of the respective VCSEL in the VCSEL array.

15. A laser arrangement comprising:
a VCSEL array comprising multiple VCSELs arranged on a common semiconductor substrate;
an optical structure; and
a diffusor structure,
wherein the optical structure is arranged to reduce a divergence angle of laser light emitted by each respective VCSEL to a section of the diffusor structure assigned to the respective VCSEL,
wherein the diffusor structure is arranged to transform the laser light received from the optical structure to transformed laser light such that a continuous illumination pattern is configured to be provided in a reference plane in a defined field-of-view,
wherein the diffusor structure is arranged to increase a size of the illumination pattern in comparison to an untransformed illumination pattern which can be provided without the diffusor structure,
wherein the VCSEL array, optical structure, and diffusor structure are arranged such that the sections of the diffusor structure assigned to different VCSELs do not overlap, wherein diffusor properties of the diffusor structure vary across the diffusor structure, wherein the variation of the diffusor properties is arranged to concentrate the illumination pattern in the defined field-of-view, and wherein the optical structure comprises a partly reflective mirror structure, wherein the partly reflective mirror structure is arranged to decrease the divergence angle of the laser light emitted by each respective VCSEL.

16. The laser arrangement according to claim 15, wherein the diffusor structure comprises diffusor substructures to vary the diffusor properties which are aligned with the sections receiving the laser light with reduced divergence angle, and wherein the diffusor substructures are configured with different surface structures to spread laser light received from the optical structure differently depending on the position of the respective VCSEL in the VCSEL array.

17. The laser arrangement according to claim 15, wherein each respective VCSEL is a top emitter arranged to emit the laser light in a direction away from the semiconductor substrate, wherein the optical structure comprises a material provided on top of a semiconductor layer structure of the VCSEL array, and wherein the material is transparent in a wavelength range of the laser light.

18. The laser arrangement according to claim 15, wherein each respective VCSEL is a bottom emitter arranged to emit the laser light through the semiconductor substrate, wherein the optical structure is provided on a surface of the semiconductor substrate which is arranged opposite with respect to the multiple VCSELs.

19. The laser arrangement according to claim 18, wherein the optical structure is a collimating optical structure integrated in a semiconductor layer structure of the VCSEL array.

20. The laser arrangement according to claim 18, wherein the optical structure comprises a material provided on top of a semiconductor layer structure of the VCSEL array, the material being transparent in a wavelength range of the laser light.

* * * * *